(12) United States Patent
Furukawa et al.

(10) Patent No.: US 9,790,590 B2
(45) Date of Patent: Oct. 17, 2017

(54) VACUUM-PROCESSING APPARATUS, VACUUM-PROCESSING METHOD, AND STORAGE MEDIUM

(71) Applicant: TOKYO ELECTRON LIMITED, Tokyo (JP)

(72) Inventors: Shinji Furukawa, Nirasaki (JP); Atsushi Gomi, Nirasaki (JP); Tetsuya Miyashita, Nirasaki (JP); Toru Kitada, Nirasaki (JP); Kanto Nakamura, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 116 days.

(21) Appl. No.: 14/403,833

(22) PCT Filed: Apr. 30, 2013

(86) PCT No.: PCT/JP2013/002888
§ 371 (c)(1),
(2) Date: Nov. 25, 2014

(87) PCT Pub. No.: WO2013/179575
PCT Pub. Date: Dec. 5, 2013

(65) Prior Publication Data
US 2015/0187546 A1   Jul. 2, 2015

(30) Foreign Application Priority Data
May 31, 2012 (JP) .................................. 2012-125531

(51) Int. Cl.
*C23C 14/34* (2006.01)
*C23C 14/14* (2006.01)
(Continued)

(52) U.S. Cl.
CPC .......... *C23C 14/5853* (2013.01); *C23C 14/08* (2013.01); *C23C 14/14* (2013.01);
(Continued)

(58) Field of Classification Search
CPC ............... H01J 37/3405; H01J 37/3426; H01J 37/3447; H01J 37/3429; H01J 37/34;
(Continued)

(56) References Cited

U.S. PATENT DOCUMENTS 4,946,576 A * 8/1990 Dietrich .............. H01J 37/3405
204/192.12
7,850,827 B2 * 12/2010 Nomura .............. C23C 14/3464
204/192.1
(Continued)

FOREIGN PATENT DOCUMENTS

JP      04099271 A      3/1992
JP      06049633 A      2/1994
(Continued)

OTHER PUBLICATIONS

International Search Report dated Jul. 12, 2013 corresponding to application No. PCT/JP2013/002888.

*Primary Examiner* — Michael Band
(74) *Attorney, Agent, or Firm* — Nath, Goldberg & Meyer; Jerald L. Meyer; Annie Kock

(57) ABSTRACT

The present disclosure provides a vacuum-processing apparatus for forming a metal film on a substrate by sputtering targets with ions of plasma, and then oxidizing the metal film, the apparatus including: a first target composed of a material having a property of adsorbing oxygen; a second target composed of a metal; a power supply unit configured to apply a voltage to the targets; a shutter configured to prevent particles generated from one of the targets from adhering to the other of the targets; a shielding member; an
(Continued)

oxygen supply unit configured to supply an oxygen-containing gas to the substrate mounted on the mounting unit; and a control unit configured to perform supplying a plasma-generating voltage to the targets and sputtering the targets and supplying the oxygen-containing gas from the oxygen supply unit to the substrate.

8 Claims, 12 Drawing Sheets

(51) Int. Cl.
    *C23C 14/35*      (2006.01)
    *C23C 14/56*      (2006.01)
    *C23C 14/58*      (2006.01)
    *C23C 14/08*      (2006.01)
    *H01J 37/34*      (2006.01)
    *H01L 43/12*      (2006.01)

(52) U.S. Cl.
    CPC ........ *C23C 14/3464* (2013.01); *C23C 14/352* (2013.01); *C23C 14/564* (2013.01); *H01J 37/34* (2013.01); *H01J 37/3405* (2013.01); *H01J 37/3426* (2013.01); *H01J 37/3429* (2013.01); *H01J 37/3447* (2013.01); *H01J 2237/3322* (2013.01); *H01L 43/12* (2013.01)

(58) Field of Classification Search
    CPC ... C23C 14/14; C23C 14/352; C23C 14/5853; C23C 14/08; C23C 14/3464; C23C 14/564
    See application file for complete search history.

(56) References Cited

U.S. PATENT DOCUMENTS

| | | | |
|---|---|---|---|
| 2010/0243438 A1* | 9/2010 | Yamaguchi | C23C 14/34 204/298.11 |
| 2012/0186521 A1* | 7/2012 | Iwasaki | C23C 16/45517 118/723 AN |
| 2012/0325651 A1* | 12/2012 | Yamaguchi | C23C 14/34 204/192.15 |

FOREIGN PATENT DOCUMENTS

| | | | | |
|---|---|---|---|---|
| JP | 06172989 A | 6/1994 | | |
| JP | 2007173843 A | 7/2007 | | |
| JP | 2008013829 A | 1/2008 | | |
| JP | 2009065181 A | 3/2009 | | |
| JP | 2009084622 A | 4/2009 | | |
| JP | WO 2011034057 A1 * | 3/2011 | ....... C23C 16/45517 |
| JP | WO 2011117945 A1 * | 9/2011 | ............ C23C 14/34 |
| KR | 10-1022014 B1 | 3/2011 | | |
| WO | 2010074076 A1 | 7/2010 | | |

\* cited by examiner

VACUUM-PROCESSING APPARATUS, VACUUM-PROCESSING METHOD, AND STORAGE MEDIUM

This is a National Phase Application filed under 35 U.S.C. 371 as a national stage of PCT/JP2013/002888, filed Apr. 30, 2013, an application claiming the benefit from the Japanese patent Application No. 2012125531, filed May 31, 2012 the content of each of which is hereby incorporated by reference in its entirety.

TECHNICAL FIELD

The present disclosure relates to a vacuum-processing apparatus and vacuum-processing method that forms a metal film on a substrate by sputtering a metal-made target and then obtains a metal oxide film by oxidizing the metal film.

BACKGROUND

In recent years, an MRAM (Magneto-resistive Random Access Memory) is highlighted as one of the memories which are expected to have superior characteristics as compared to conventional memories such as a DRAM and the like. A basic mechanism of an MRAM memory device is shown in FIGS. 12A and 12B. The MRAM memory device includes an insulation film 91 and ferromagnetic layers 92a and 92b installed on both sides of the insulation film 91. The magnetization direction of the ferromagnetic layer 92a is variable and the magnetization direction of the ferromagnetic layer 92b is fixed. When the magnetization directions of the ferromagnetic layers 92a and 92b are opposite to each other as shown in FIG. 12A, a resistance value of the insulation film 91 is increased. Thus, it becomes harder for current to flow from the ferromagnetic layer 92a to the ferromagnetic layer 92b. The MRAM uses this state as a "1" state of a memory device. Conversely, if the magnetization directions of the ferromagnetic layers 92a and 92b are identical with each other as shown in FIG. 12B, the resistance value of the insulation film 91 is decreased. Thus, it becomes easier for current to flow from the ferromagnetic layer 92a to the ferromagnetic layer 92b. The MRAM uses this state as a "0" state of a memory device.

A metal oxide film is used as the insulation film. If the resistance value of the metal oxide film is changed, the characteristic of the metal oxide film as the MRAM is also changed. Thus, the magnitude of a current required in writing "0" or "1" is changed. For that reason, a tight tolerance range is set with respect to the resistance value of the metal oxide film of the MRAM.

As a film-forming process of the metal oxide film, Japanese Patent Application Publication No. H6-172989 discloses a method (reactive sputtering method) for sputtering a target composed of a metal oxide. However, this method suffers from a problem in that the surface of the metal target is gradually oxidized during the sputtering. Japanese Patent Application Publication No. 2008-13829 discloses a method in which a metal oxide film is formed on a substrate by sputtering a metal-made target while introducing an oxygen gas into a sputtering apparatus. However, this method suffers from a problem in that the surface of the target is oxidized by residual oxygen and the resistance value of the metal oxide film becomes unstable. Japanese Patent Application Publication No. H6-49633 discloses a method in which a metal film is formed within one processing chamber and is then oxidized in another oxygen-supplied chamber while supplying oxygen. However, the use of two or more chambers leads to a reduction in overall apparatus throughput. Moreover, the oxygen introduced into the oxygen-supplied chamber remains within the chamber. Thus, there is a concern that residual oxygen might cause the resistance value of the metal oxide film to vary from substrate to substrate.

The metal oxide films formed by the methods disclosed in the three Japanese publications cited above are insufficient in terms of the stability of the resistance value among substrates. This poses a problem in that it is impossible to obtain a high yield rate.

Japanese Patent Application Publication No. 2009-65181 discloses an MRAM manufacturing method in which a processing chamber provided with two targets is used to perform gettering prior to the formation of a metal oxide film. However, this method does not provide motivation for the present disclosure, because the material of the metal oxide film (MgO in that disclosure) is directly used as a target.

SUMMARY

Under these circumstances, it is an object of the present disclosure to provide a technique of forming a metal oxide film whose resistance value is stable between substrates.

In one embodiment of the present disclosure, there is provided a vacuum-processing apparatus for forming a metal film on a substrate by sputtering a target disposed so as to face toward the substrate mounted on a mounting unit existing within a vacuum container, with ions of plasma obtained by converting a plasma-generating gas to plasma, and oxidizing the metal film, the apparatus including: a first target composed of a material having a property of adsorbing oxygen; a second target composed of a metal; a power supply unit configured to apply a voltage to the first target and the second target; a shutter configured to, when sputtering one of the first target and the second target, prevent particles generated from one of the first target and the second target from adhering to the other of the first target and the second target; a shielding member movable between a shielding position where the shielding member covers the substrate in order to prevent particles generated from the first target from adhering to the substrate and a retracted position where the shielding member is retracted from the shielding position; an oxygen supply unit configured to supply an oxygen-containing gas to the substrate mounted on the mounting unit; and a control unit configured to perform a step of, in a state in which the shielding member is kept in the shielding position, supplying a plasma-generating voltage to the first target and sputtering the first target in order to adhere particles of the first target to the inside of the vacuum container, a step of, in a state in which the supply of the voltage to the first target is stopped and the shielding member is kept in the retracted position, supplying a plasma-generating voltage to the second target and sputtering the second target in order to form a metal film on the substrate, and a step of supplying the oxygen-containing gas from the oxygen supply unit to the substrate.

In another embodiment of the present disclosure, there is provided a vacuum-processing apparatus for forming a metal film on a substrate by sputtering a target disposed so as to face toward the substrate mounted on a mounting unit existing within a vacuum container, with ions of plasma obtained by converting a plasma-generating gas to plasma, and oxidizing the metal film, the apparatus including: a target composed of a metal having a property of adsorbing oxygen; a power supply unit configured to apply a voltage to the target; a shielding member movable between a shielding position where the shielding member covers the substrate in order to prevent particles generated from the target from adhering to the substrate and a retracted position where the shielding member is retracted from the shielding position; an oxygen supply unit configured to supply an oxygen-containing gas to the substrate mounted on the mounting unit; and a control unit configured to perform a step of, in a state in which the shielding member is kept in the shielding position, supplying a plasma-generating voltage to the target and sputtering the target in order to adhere particles of the target to the inside of the vacuum container, a step of, in a state in which the supply of the voltage to the target is stopped and the shielding member is kept in the retracted position, supplying a plasma-generating voltage to the target and sputtering the target in order to form a metal film on the substrate, and a step of supplying the oxygen-containing gas from the oxygen supply unit to the substrate.

In another embodiment of the present disclosure, there is provided a vacuum-processing method for forming a metal film on a substrate by sputtering a target disposed so as to face toward the substrate mounted on a mounting unit existing within a vacuum container, with ions of plasma obtained by converting a plasma-generating gas to plasma, and oxidizing the metal film, the method including: preparing a first target composed of a material having a property of adsorbing oxygen and a second target composed of a metal; covering the substrate on the mounting unit with a shielding member in order to prevent particles generated from the first target from adhering to the substrate, and disposing a shutter in a position facing the second target in order to prevent particles generated from the first target from adhering to the second target; sputtering the first target by supplying a plasma-generating voltage to the first target, and causing particles of the first target to adhere to the inside of the vacuum container; stopping the supply of the voltage to the first target, disposing the shutter in a position facing the first target in order to prevent particles generated from the second target from adhering to the first target, and retracting the shielding member from a position where the shielding member covers the substrate; sputtering the second target by supplying a plasma-generating voltage to the second target, and forming a metal film on the substrate; and supplying an oxygen-containing gas to the substrate mounted on the mounting unit.

In another embodiment of the present disclosure, there is provided a vacuum-processing method for forming a metal film on a substrate by sputtering a target disposed so as to face toward the substrate mounted on a mounting unit existing within a vacuum container, with ions of plasma obtained by converting a plasma-generating gas to plasma, and then oxidizing the metal film, the method including: preparing a target composed of a metal having a property of adsorbing oxygen; shielding the substrate on the mounting unit with a shielding member in order to prevent particles generated from the target from adhering to the substrate; sputtering the target by supplying a plasma-generating voltage to the target, and causing particles of the target to adhere to the inside of the vacuum container; in a state in which the shielding member is retracted from a position where the shielding member covers the substrate, sputtering the target by supplying a plasma-generating voltage to the target, and forming a metal film on the substrate; and supplying an oxygen-containing gas to the substrate mounted on the mounting unit.

Further, in the present disclosure, there is provided a storage medium which stores a computer program used in a vacuum process for forming a metal film on a substrate by sputtering a target disposed so as to face toward the substrate mounted on a mounting unit existing within a vacuum container, with ions of plasma obtained by converting a plasma-generating gas to plasma, and oxidizing the metal film, wherein the computer program is used to carry out the aforementioned vacuum-processing method.

The present disclosure utilizes a first target which is an oxygen gettering material having an oxygen adsorption property and a second target which is composed of a film-forming metal. A gettering material is caused to adhere to the inside of a vacuum container by sputtering the first target in a state in which a substrate is shielded by a shielding member. Thereafter, a metal film is formed on the substrate by sputtering the second target in a state in which the shielding member is opened. Subsequently, the shielding member is closed and the metal film is oxidized by supplying oxygen to the substrate. Thus, the metal film is formed in such a state that the oxygen remaining within the vacuum container is reduced. This makes it possible to accurately control the amount of oxygen contained in a metal oxide film. For that reason, the resistance value of the metal oxide film is stable between substrates.

DETAILED DESCRIPTION

Figure 1:
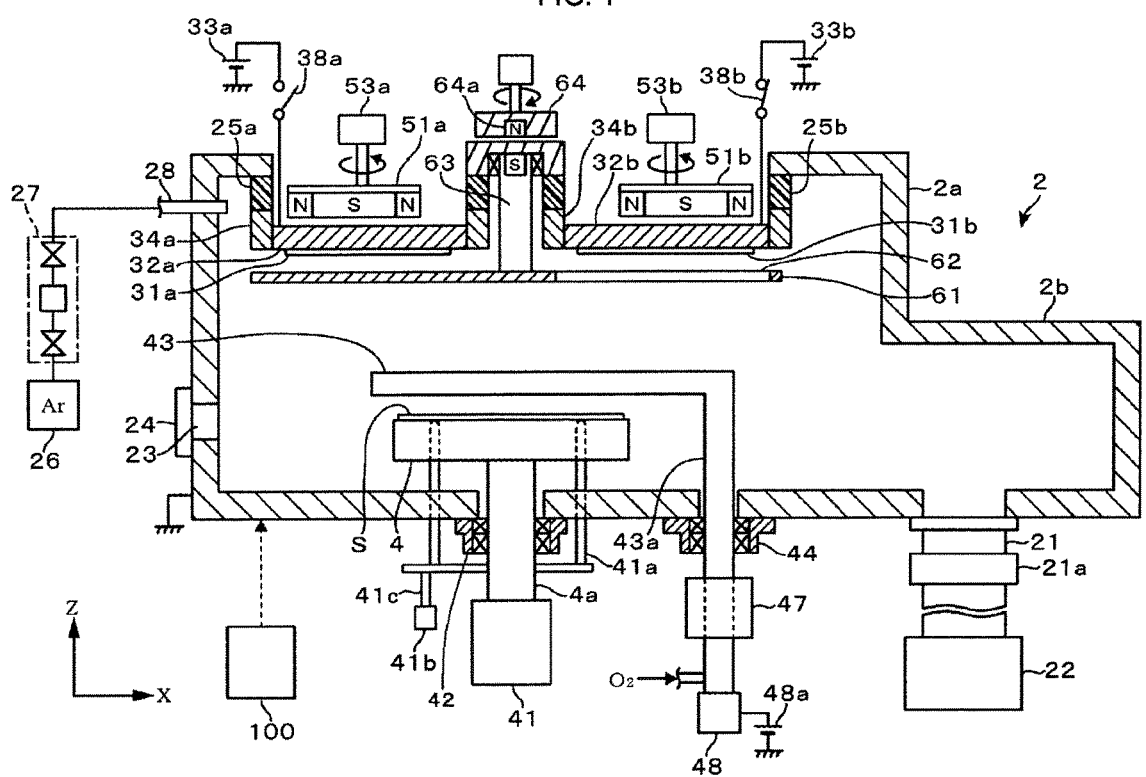
FIG. 1 is a vertical sectional view illustrating a vacuum-processing apparatus according to a first embodiment of the present disclosure.
Figure 2:
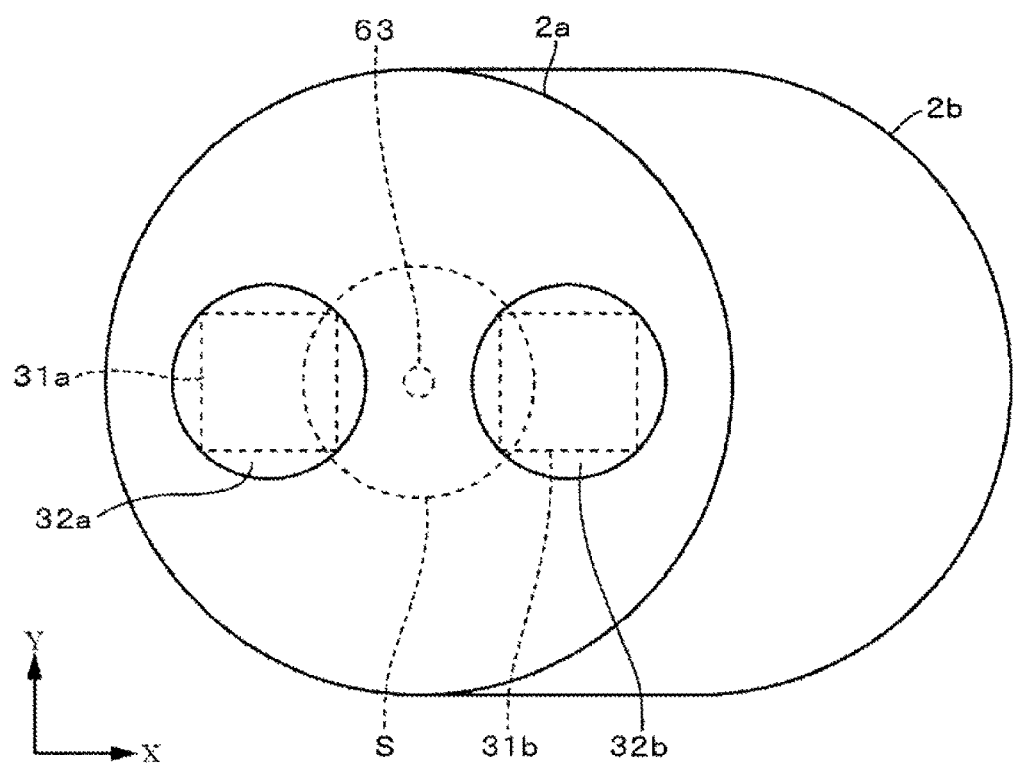
FIG. 2 is a top plan view of the vacuum-processing apparatus according to the first embodiment.

Referring to FIG. 1, a vacuum-processing apparatus according to a first embodiment of the present disclosure includes a grounded vacuum container 2 made of a conductive material, e.g., stainless steel. The vacuum container 2 includes a cylindrical portion 2a and a protrusion portion 2b. FIG. 2 is a top plan view of the vacuum container 2. In the ceiling of the cylindrical portion 2a, a first target electrode 32a and a second target electrode 32b, which have a circular shape and a substantially equal size, are horizontally installed side by side along a left-right direction (in parallel with the X-axis direction). The target electrodes 32a and 32b are respectively bonded to ring-shaped insulation bodies 25*a* and 25*b* through ring-shaped retainers 34*a* and 34*b*. The insulation bodies 25*a* and 25*b* are bonded to the ceiling of the vacuum container 2. Thus, the target electrodes 32*a* and 32*b* are electrically insulated from the vacuum container 2 and are disposed in a drop-down position lower than the top surface of the cylindrical portion 2*a*.

A first target 31*a* is bonded to the lower surface of the first target electrode 32*a*. A second target 31*b* is bonded to the lower surface of the second target electrode 32*b*. The targets 31*a* and 31*b* are approximately equal in size to each other and are formed into a rectangular shape such as a square shape or the like.

Figure 3:
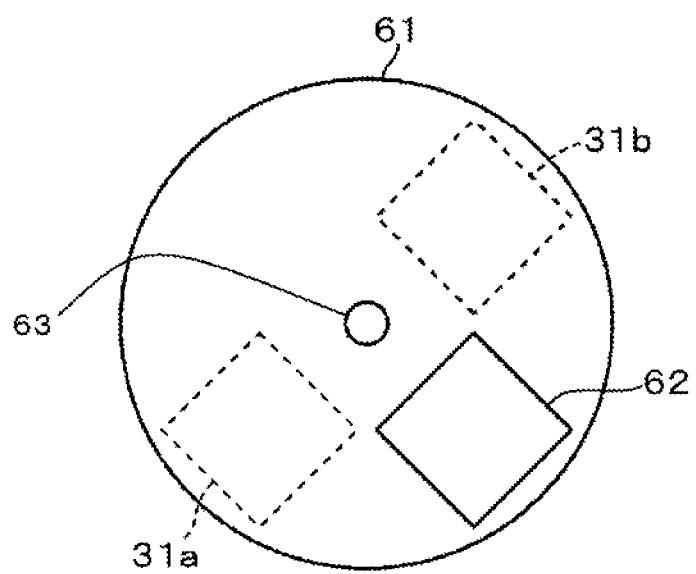
FIG. 3 is a bottom plan view showing a shutter used in the first embodiment.

A shutter 61 is provided just below the targets 31*a* and 31*b*. FIG. 3 is a bottom plan view of the shutter 61. The shutter 61 is a circular plate larger in size than the projection region of the targets 31*a* and 31*b*. The shutter 61 is rotatably installed at the center of the top surface of the cylindrical portion 2*a* through a rotation shaft 63. Furthermore, the shutter 61 has a rectangular opening 62 which is a little larger in size than the target 31*a* or 31*b* and which is formed at a position where the entirety of the target 31*a* or 31*b* can be observed from the lower side of the shutter 61 when the rotation-direction position of the shutter 61 is aligned with the target 31*a* or 31*b*. Accordingly, when the opening 62 is positioned at a region facing one of the targets 31*a* and 31*b*, the other of the targets 31*a* and 31*b* is covered by the shutter 61. During the time when one of the targets 31*a* and 31*b* is sputtered, the kicked-out particles are prevented from adhering to the other of the targets 31*a* and 31*b*. A rotational drive unit 64 having a magnet 64*a* is installed at a position corresponding to the rotation shaft 63 at the upper side of the ceiling of the vacuum container 2. The rotation shaft 63 is rotated by the magnetic coupling between the magnet 64*a* and the magnet installed at the side of the rotation shaft 63.

The target electrodes 32*a* and 32*b* are respectively connected to power supply units 33*a* and 33*b* such that, for example, a negative DC voltage is applied to the target electrodes 32*a* and 32*b*. Switches 38*a* and 38*b* are installed between the first target electrode 32*a* and the power supply unit 33*a* and between the second target electrode 32*b* and the power supply unit 33*b*.

The first target 31*a* is formed of a member capable of absorbing oxygen or moisture (hereinafter referred to as a "gettering member"). Examples of the material of the first target 31*a* includes titanium (Ti), chromium (Cr), tantalum (Ta), zirconium (Zr), magnesium (Mg), hafnium (Hf) and an alloy thereof. On the other hand, the material of the second target 31*b* is the same as the material of a film formed on a substrate S. Examples of the material of the second target 31*b* includes metals such as magnesium (Mg), aluminum (Al), nickel (Ni), gallium (Ga), manganese (Mn), copper (Cu), silver (Ag), zinc (Zn), hafnium (Hf) and the like. In this embodiment, Ti is used as a gettering member and Mg is used as the material of the film.

Within the vacuum container 2, there is installed a mounting unit 4 on which a substrate S is horizontally mounted so as to oppose the targets 31*a* and 31*b*. The mounting unit 4 is connected to a drive mechanism 41 disclosed below the vacuum container 2, through a shaft member 4*a*. The drive mechanism 41 plays a role of rotating the mounting unit 4 and a role of raising and lowering the substrate S, e.g., a semiconductor silicon wafer, between a position where the substrate S is delivered to and from an external transfer mechanism (not shown) through lifter pins 41*a* and a processing position where sputtering is performed. Reference symbol 42 designates a seal portion. A heating mechanism (not shown) is built within the mounting unit 4 so that the heating unit can heat the substrate S during sputtering. Three lifter pins 41*a* are installed so as to support the lower surface of the substrate S at three points and are moved up and down by a lift unit 41*b* through a support member 41*c*.

Figure 4:
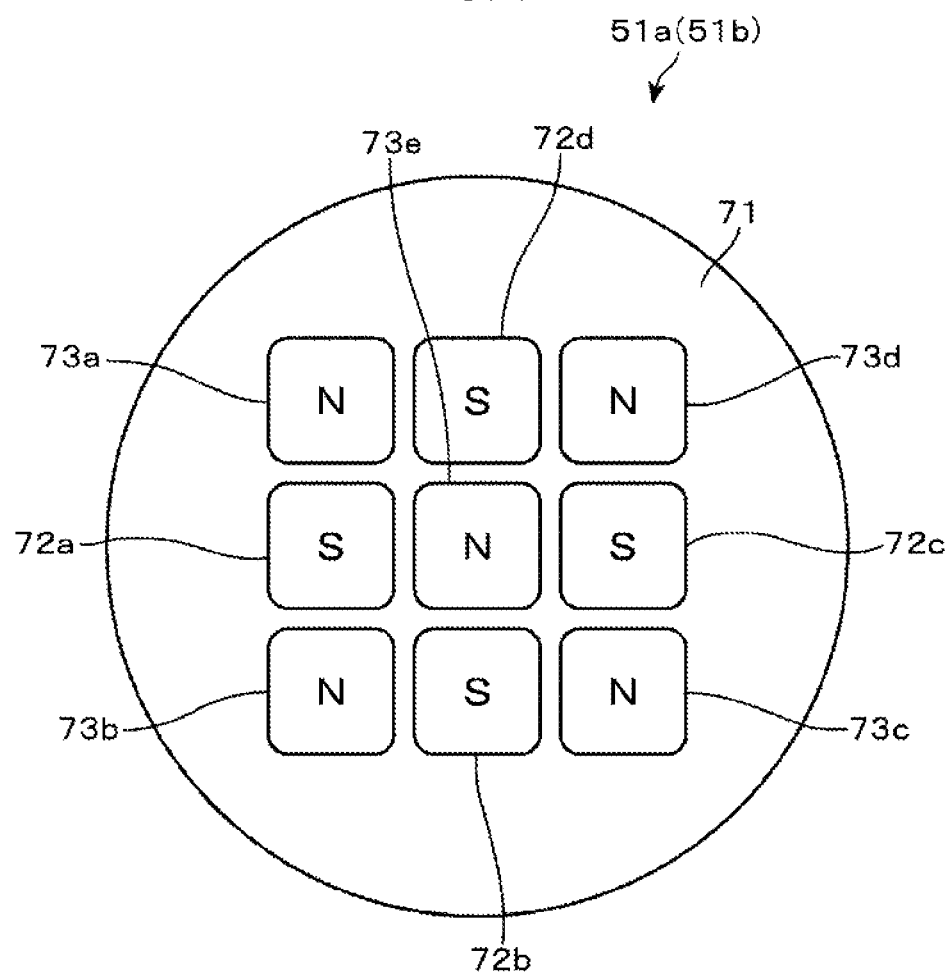
FIG. 4 is a plan view showing one example of a magnet array used in the first embodiment.

Magnet arrays 51*a* and 51*b* are installed above the target electrodes 32*a* and 32*b* so as to adjoin the target electrodes 32*a* and 32*b*, respectively. Each of the magnet arrays 51*a* and 51*b* is configured by disposing an S-pole magnet group 72*a* to 72*d* and an N-pole magnet group 73*a* to 73*e* on a base 71, which is made of a material having high magnetic permeability, e.g., iron (Fe), in a matrix pattern. FIG. 4 is a plan view in which the S-pole magnet group 72*a* to 72*d* and the N-pole magnet group 73*a* to 73*e* are viewed at the side of the targets 31*a* and 31*b*.

Each of the magnet arrays 51*a* and 51*b* is disposed at an off-centered position in order to increase erosion uniformity of the targets 31*a* and 31*b* and is rotated about the center of each of the targets 31*a* and 31*b* by each of rotating mechanisms 53*a* and 53*b*.

Figure 5A:
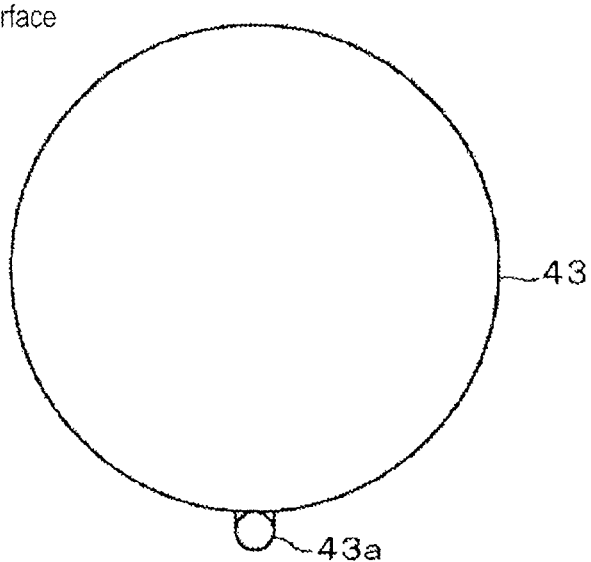
FIGS. 5A and 5B are top and bottom plan views showing a cover plate used in the first embodiment.
Figure 5B:
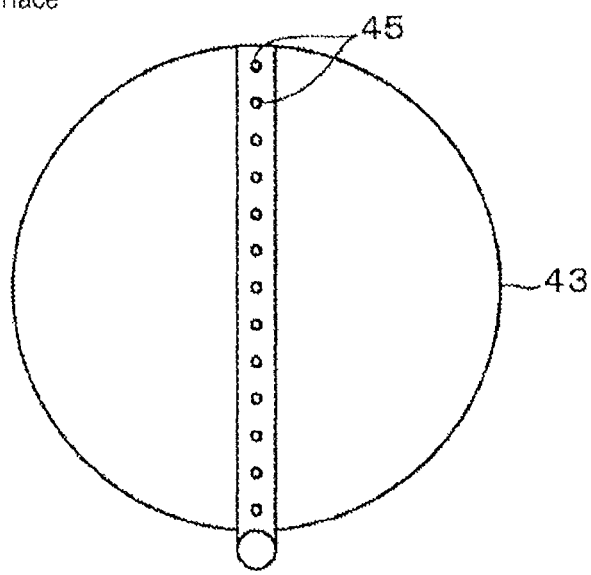

Within the vacuum container 2, a circular cover plate 43, which is a shielding member larger in size than the substrate S, is installed in order to prevent particles generated from the first target 31*a* from adhering to the substrate S. FIG. 5A is a top plan view of the cover plate 43. The cover plate 43 is configured to horizontally swing about a support post 43*a* installed in an edge portion of the cover plate 43. The cover plate 43 swings between a shielding position where the cover plate 43 covers the substrate S and a retracted position where the cover plate 43 is retracted from the shielding position. The support post 43*a* extends through the bottom portion of the vacuum container 2. The support post 43*a* is rotatably supported by a rotation support portion 48 so that it can be rotated by a rotational drive unit 47. Reference symbol 44 designates a seal mechanism. In the illustrated example, the cover plate 43 has not only the aforementioned shielding function but also a function of supplying oxygen ($O_2$) to the substrate S. More specifically, as shown in FIG. 5B, gas injection holes 45 are arranged at the lower surface of the cover plate 43 at a regular interval along the diameter of the cover plate 43.

Figure 6:
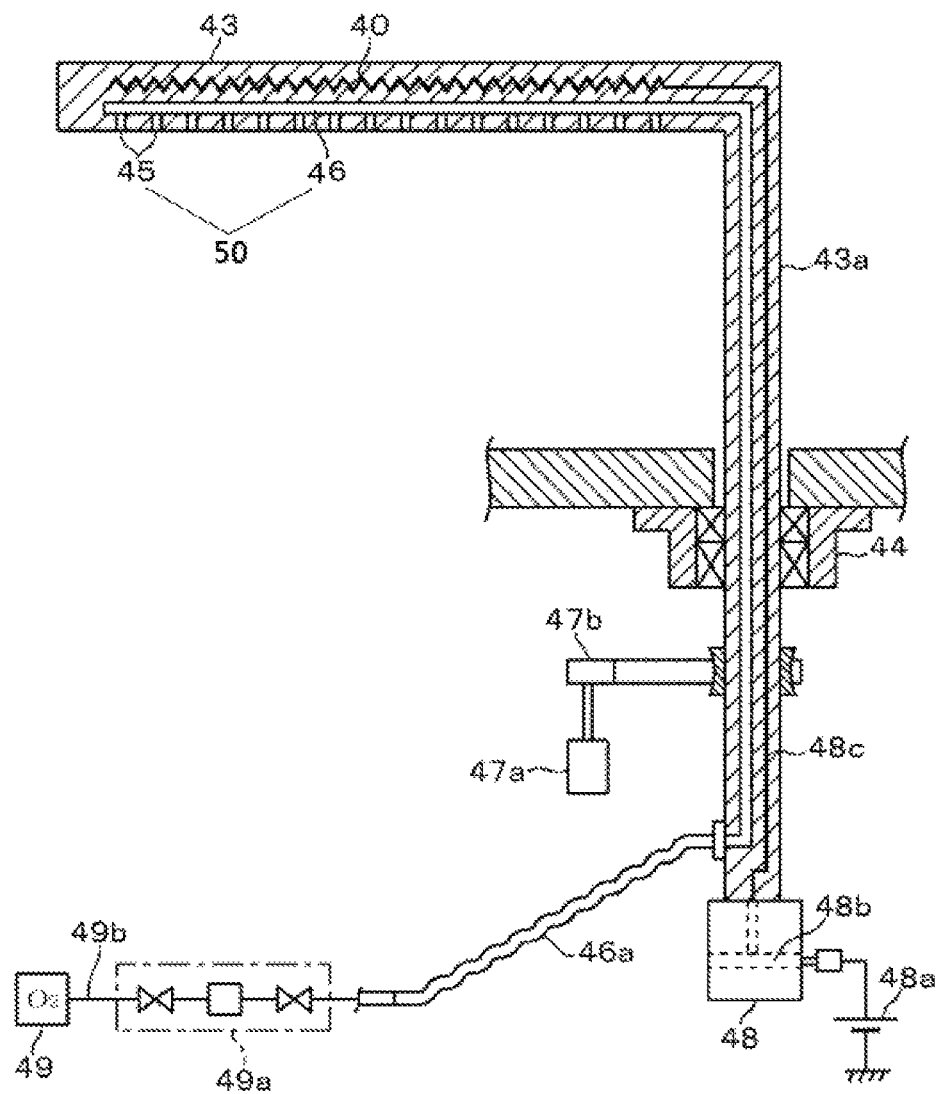
FIG. 6 is a sectional view showing the details of the cover plate used in the first embodiment and the peripheral parts of the cover plate.

FIG. 6 is a view showing the detailed structure of the cover plate 43 and the support post 43*a*. Within the cover plate 43 and the support post 43*a*, there is installed an oxygen gas supply path 46. A flexible tube 46*a* which forms a gas supply path is connected to an upstream end portion of the oxygen gas supply path 46. The flexible tube 46*a* is connected to an oxygen gas supply source 49 through a gas supply pipe 49*b* in which a gas control instrument group 49*a* such as a valve, a flow meter and the like is installed. An oxygen gas supplied from the oxygen gas supply source 49 is moved through the oxygen gas supply path 46 formed within the support post 43*a* and the cover plate 43 and is injected from the aforementioned gas injection holes 45. The oxygen gas supply path 46 and the gas injection holes 45 constitute an oxygen supply unit 50. In the present embodiment, a motor 47*a* and a belt 47*b* are used as one example of the rotational drive unit 47. However, the rotational drive unit 47 is not limited thereto. A slip ring 48*b* is installed at the rotation support portion 48. A current supply line 48*c* is installed within the support post 43*a*. The current supply line 48*c* is electrically connected to an external power supply unit 48*a* through the slip ring 48*b*.

A heater 40 which constitutes a heating unit as a temperature control mechanism connected to the current supply line 48*c* is installed within the cover plate 43. An oxygen gas existing within the oxygen gas supply path 46 is preheated by the heater 40. The installation region of the heater 40 is not limited to the inside of the cover plate 43. The heater 40 may be installed within the support post 43a or may be installed within both the cover plate 43 and the support post 43a. The cover plate 43 and the support post 43a may have internal cavities. The oxygen gas supply path 46, the current supply line 48c and the heater 40 may be installed in the cavities.

An exhaust path 21 is connected to the bottom portion of the vacuum container 2. The exhaust path 21 is connected to a vacuum exhaust device 22 through a pressure regulating unit 21a. A gate valve 24 for opening and closing a substrate carry-in/out port 23 is installed at the side surface of the vacuum container 2. An Ar gas supply path 28 for supplying an inert gas as a plasma-generating gas, e.g., an Ar gas, into the vacuum container 2 is installed at the upper sidewall of the vacuum container 2. The Ar gas supply path 28 is connected to an Ar gas supply source 26 via a gas control instrument group 27 such as a valve, a flow meter and the like.

The vacuum-processing apparatus includes a control unit 100 formed of a computer configured to control individual operations. Specific examples of the individual operations include an operation of supplying electric power from the power supply units 33a and 33b, an operation of supplying an Ar gas from the Ar gas supply source 26, an operation of raising, lowering and rotating the mounting unit 4 by the drive mechanism 41, an operation of rotating the cover plate 43, an operation of supplying an oxygen gas to the cover plate 43, an operation of rotating the magnet arrays 51a and 51b, an operation of rotating the shutter 61, and an operation of exhausting the inside of the vacuum container 2 with the vacuum exhaust device 22. The control unit 100 executes the control of the vacuum-processing apparatus as a whole, at which time a program incorporating a command group for the control required in forming a metal oxide film on the substrate S is read from an external storage medium such as, e.g., a hard disk, a tape storage, a compact disk, a magneto-optical disk, a memory card or the like.

Next, the operations of the vacuum-processing apparatus will be described with reference to FIGS. 1, 7, 8 and 9. First, the substrate S is carried into the vacuum container 2 through the carry-in/out port 23 by means of a transfer mechanism installed at an external vacuum transfer chamber (not shown). The substrate S is mounted on the mounting unit 4. The gate valve 24 is closed. Then, the pressure regulating unit 21a is fully opened to create a vacuum inside of the vacuum container 2.

Figure 7A:
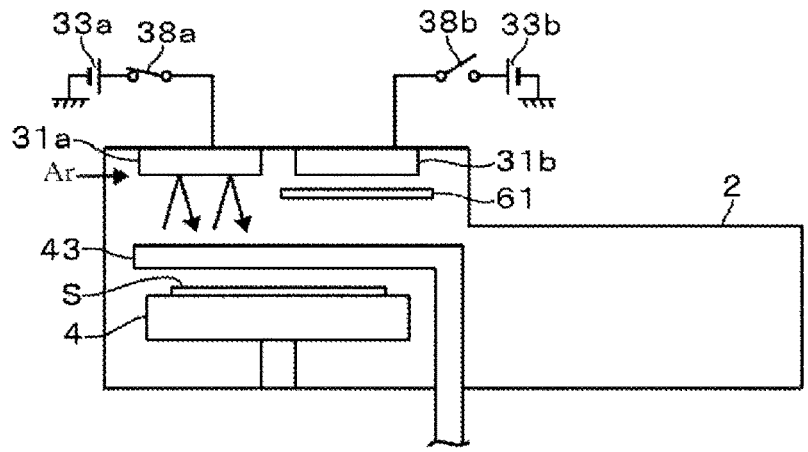
FIGS. 7A, 7B, 7C, 8D and 8E are explanatory views illustrating the operation of the first embodiment.
Figure 9:
FIG. 9 is an explanatory view showing the step-dependent operations of the respective parts of the vacuum-processing apparatus.

FIG. 9 is an explanatory view showing a sequence in which the operations of the respective parts are arranged chronologically. During the carry-in of the substrate S, the shutter 61 is fully closed (arranged in a closed position with respect to the targets 31a and 31b) and the cover plate 43 is located in a shielding position (Step 1). An Ar gas is introduced from the Ar gas supply source 26, whereby the internal pressure of the vacuum container 2 is set at, e.g., 100 mPa (0.8 mTorr). The power supply unit 33a existing at the side of the first target 31a, i.e., at the Ti target side, is turned on to apply a DC voltage of, e.g., 380 V, to the first target electrode 32a (Step 2). The magnet array 51a is rotated and the shutter 61 is rotated such that the first target 31a is opened (Step 3). Then, the Ar gas is converted to plasma at a high density by the electric fields applied to the first target 31a and the magnetic fields generated by the magnet array 51a. The first target 31a is sputtered by the plasma such that Ti particles are kicked out. The Ti particles adhere to the wall surface of the vacuum container 2 and the upper surface of the cover plate 43, thereby forming a film. This is shown in FIG. 7A. The sputtering of the Ti particles toward the inside of the vacuum container 2 is performed for, e.g., 10 seconds. Then, the application of the voltage to the first target 31a and the supply of the Ar gas are stopped. The magnet array 51a is stopped. The shutter 61 is closed (Step 4). The Ti particles attached to the inside of the vacuum container 2 by the sputtering absorb oxygen molecules or water molecules existing within the vacuum container 2 and become titanium oxides. Thus, the internal pressure of the vacuum container 2 is decreased to $9 \times 10^{-8}$ Pa. Prior to sputtering the first target 31a, the internal pressure of the vacuum container 2 is $4 \times 10^{-7}$ Pa. This supports the fact that the gettering effect offered by Ti is remarkable.

Figure 7B:
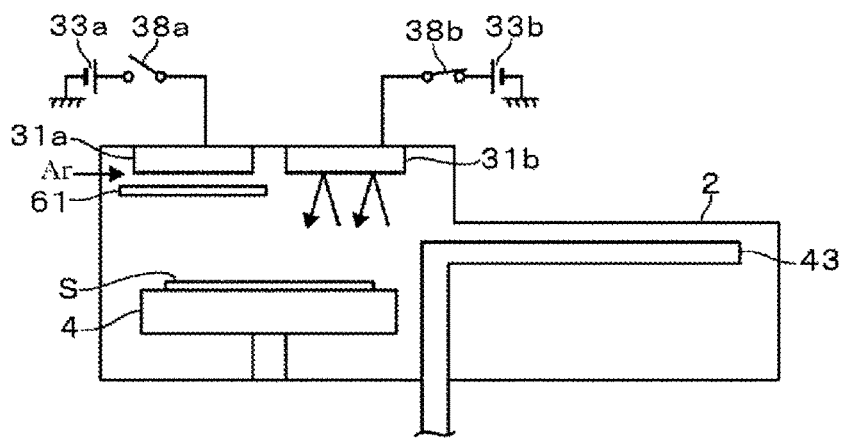

After the sputtering of Ti is finished, Mg is sputtered on the substrate S. More specifically, the supply of the Ar gas is resumed, whereby the internal pressure of the vacuum container 2 is set at, e.g., 100 mPa (0.8 mTorr). The magnet array 51b is rotated and a DC voltage of, e.g., 300 V, is applied to the second target electrode 32b (the second target 31b) (Step 5). The cover plate 43 is retracted from above the mounting unit 4 (Step 6). While rotating the mounting unit 4, the shutter 61 is rotated such that the second target 31b is opened (Step 7). Thus, the Ar gas is converted to plasma and the second target 31b is sputtered. Mg particles are attached to the substrate S. An Mg film having a film thickness of, e.g., 3 Å (0.3 nm), is formed on the substrate S. The sputtering of the Mg particles toward the substrate S is performed for about 10 seconds. This is shown in FIG. 7B. Then, the application of the voltage to the second target 31b and the supply of the Ar gas are stopped (Step 8). The magnet array 51b is stopped. The shutter 61 is closed (Step 9).

Figure 7C:
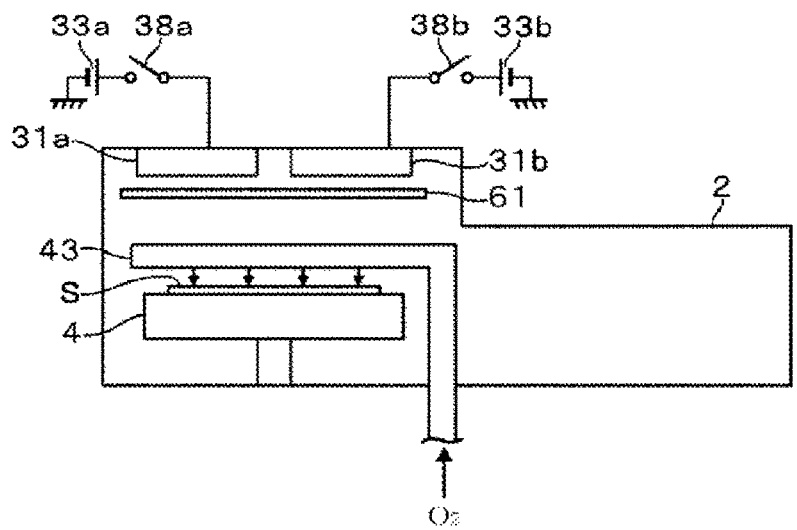

As shown in FIG. 7C, the oxygen gas supplied from the oxygen gas supply source 27 is preheated by the heater 40. In this state, the oxygen gas is injected from the gas injection holes 45 of the cover plate 43 and is supplied on the surface of the substrate S. For example, a pure oxygen gas is injected at a flow rate of 1 sccm for 20 seconds (Step 10). Due to the supply of the oxygen gas, the Mg film is oxidized into an MgO film. The flow rate of the pure oxygen gas is set to fall within a range of, e.g., 0.1 to 100 sccm.

The sputtering of the Mg particles and the supply of the oxygen gas to the Mg film are continuously repeated, e.g., twice. Three layers of the MgO film having a thickness of 3 Å are formed by the process in which the step of sputtering the Mg particles and the step of supplying the oxygen gas to the Mg film are continuously performed three times as a whole. Consequently, an MgO film having a total thickness of about 9 Å (0.9 nm) is formed on the substrate S as a whole.

In this process, the amount of the oxygen supplied to the Mg film can be changed in each step. By adjusting the flow rate of oxygen in each step, it is possible to control the resistance value of the MgO film thus formed. As one example, the flow rate of oxygen supplied to the Mg film is set at 0.1 sccm in the first step, at 1 sccm in the second step and at 10 sccm at the third step. As the condition of the oxygen flow rate, it is suitable to use a condition of 0.1 sccm to 40 sccm in the case where the second target 31b is Mg and to use a condition of 10 sccm to 100 sccm in case where the second target 31b is Ni. When a laminated film is formed by continuously repeating the aforementioned step a multiple number of times, in order to adjust the resistance value of each partitioned film which constitutes the laminated film, the flow rate of the oxygen gas may be set differently in each step, e.g., between at least two partitioned films.

Now, description will be made on the reason why the cover plate 43 shown in FIG. 6 is used when supplying the oxygen gas to the Mg film. Oxygen is very reactive and, therefore, has a property of reacting with and being adsorbed into a material existing near oxygen molecules. For that reason, if the oxygen gas is supplied to the substrate S from a position farther from the substrate S, the oxygen gas reacts with and is adsorbed into a material existing around the oxygen gas before the oxygen gas reaches the substrate S. Accordingly, it is difficult to supply oxygen to the Mg film. Thus, oxygen is consumed in a larger amount and cannot be stably supplied onto the substrate S. For the aforementioned reason, the oxygen gas is supplied onto the substrate S from the vicinity of the substrate S by using the cover plate 43. During the introduction of oxygen, from the viewpoint of preventing oxidization of the targets, the shutter 61 is moved to a position where the targets 31a and 31b are shielded.

Figure 8D:
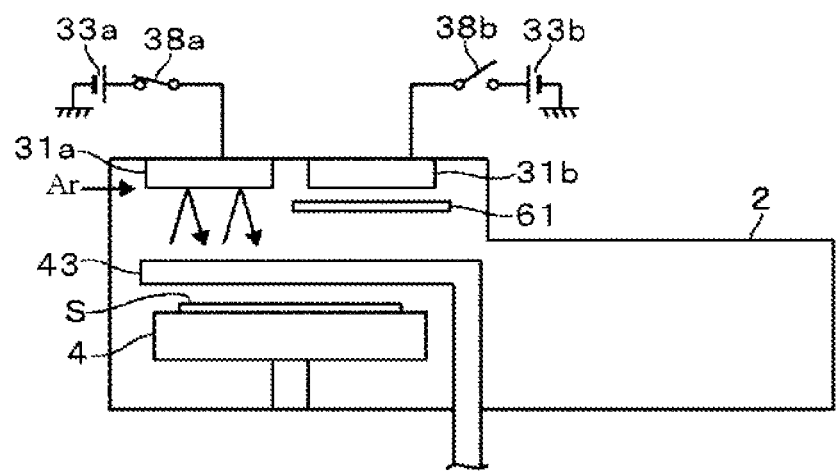

Referring back to FIGS. 1 and 8, further description will be made. After the third step of supplying the oxygen gas is finished, the Ar gas is supplied again while keeping the cover plate 43 in the shielding position above the mounting unit 4. The magnet array 51a is rotated. A DC voltage is applied to the first target electrode 32a. If the first target 31a is opened by rotating the shutter 61, Ti particles are sputtered again into the vacuum container 2 (Step 11). Subsequently, the application of the voltage to the first target 31a and the supply of the Ar gas are stopped. The magnet array 51a is stopped. The shutter 61 is closed. The sputtering of the Ti particles is performed for, e.g., about 10 seconds. This is shown in FIG. 8D. By virtue of this Ti sputtering step, a surplus oxygen gas is removed from the upper surface of the MgO film of the substrate S and the inside of the vacuum container 2.

Figure 8E:
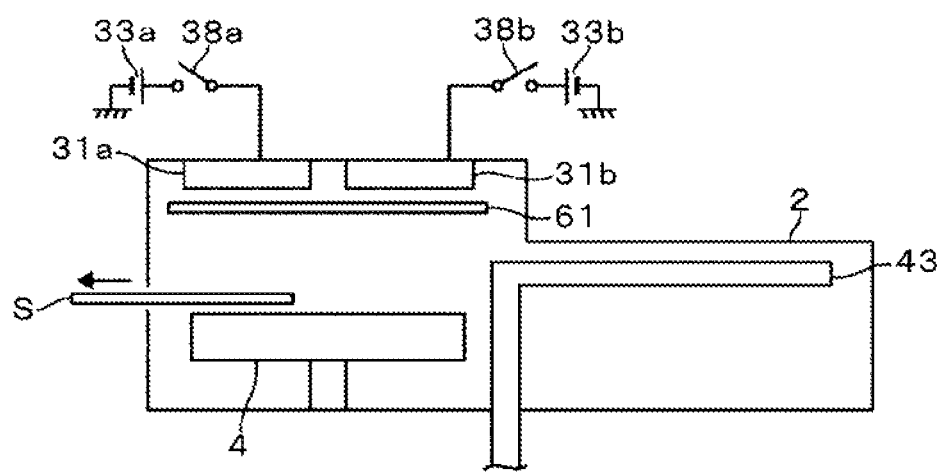

Thereafter, the shutter 61 is kept in a position where the targets 31a and 31b are closed. The cover plate 43 is retracted from above the mounting unit 4. The gate valve 24 is opened and the substrate S is carried out from the carry-in/out port 23 (Step 12). This is shown in FIG. 8E.

In the aforementioned embodiment, the step of forming the MgO film on one substrate is performed in one vacuum container shown in FIG. 1. This makes it possible to suppress introduction of oxygen from the outside. Before and after the step of forming the MgO film on the substrate S, the sputtering of Ti is performed with the substrate S shielded by the cover plate 43 and then the oxygen existing within the vacuum container 2 is removed. This makes it possible to form the Mg film in such a state that the oxygen remaining within the vacuum container 2 is reduced. Thus, since the degree of oxidization of Mg can be controlled by the supply amount of the oxygen gas, the resistance value is stabilized between substrates S. Accordingly, some embodiments of the present disclosure are effective in terms of quality improvement when producing a memory device, such as an MRAM memory device or the like, which utilizes an MgO film as an insulation film.

In the aforementioned embodiment, the step of forming the Mg film and the step of oxidizing the Mg film into the MgO film need not be necessarily repeated in the process of forming the MgO film on the substrate S. As mentioned above, the film-forming material is not limited to Mg. Metals such as Al, Ni, Hf, Ga, Zn and the like or the alloys thereof may be used as the film-forming material.

When sputtering the first target 31a, in some embodiments, the distance from the upper surface of the cover plate 43 to the substrate S is, e.g., 130 mm or less which is ½ or less of the distance between the first target 31a and the substrate S, i.e., 260 mm. With regard to the size of the cover plate 43 for obtaining a shielding effect, the diameter of the cover plate 43 can be made smaller by positioning the cover plate 43 closer to the substrate S. This is because the shielding effect is increased as the cover plate 43 comes closer to the substrate S.

In the case where an extremely thin MgO film having a thickness of, e.g., 3 Å, is formed by performing the Mg sputtering treatment and the oxidization treatment once, in some embodiment the distance between the lower surface of the cover plate 43 and the substrate S is set at 10 mm to 120 mm, if the thickness of the cover plate 43 is, e.g., 10 mm. For example, the distance between the lower surface of the cover plate 43 and the substrate S is set at 30 mm. The distance between the gas injection holes 45 and the substrate S is adjusted by, e.g. moving the mounting unit 4 upward. The reason for setting the distance in this way is to make the injected oxygen amount as small as possible from the viewpoint of preventing oxygen molecules from adhering to the targets and the chamber wall and from the viewpoint of reducing the consumption amount of the oxygen.

<Modified Examples>

The oxygen gas injection holes 45 may not be disposed along a line as in the aforementioned embodiment, but may be disposed in vertical and horizontal directions or in a concentric pattern within the projection region of the substrate. In addition, the oxygen gas supply unit including the gas injection holes 45 and the oxygen gas supply path 46 is not limited to being formed as a single body with the cover plate 43 but may be formed independently of the cover plate 43. In this case, the oxygen gas supply unit may be configured such that, independently of the operation of the cover plate 43, the oxygen gas supply unit can be moved by a moving mechanism between an upper position existing above the substrate S and a position retracted from the upper position.

The oxygen gas supply unit may be configured by, e.g., a gas supply pipe extending through the side wall of the vacuum container 2. The position of the oxygen gas injection holes may be fixed. Depending on the layout of the exhaust port and the oxygen gas supply unit, the injection holes for supplying the oxygen gas from the oxygen gas supply unit to the substrate S may be positioned below the substrate. In the aforementioned embodiment, the oxygen gas is preheated. However, the oxygen gas may not be preheated. The cover plate 43 may be configured to linearly move in a horizontal direction instead of swinging in an arc like path. Depending on the apparatus configuration, the flow of an exhaust stream and the arrangement of the exhaust port, the targets 31a and 31b may not be closed by the shutter 61 when the oxygen gas is supplied from the oxygen gas supply unit to the substrate S.

In the aforementioned embodiment, the first and second targets 31a and 31b are arranged in parallel with the substrate S mounted on the mounting unit 4. However, the present disclosure is not limited to this arrangement. The first and second targets 31a and 31b may be inclined such that the respective end portions of the first and second targets 31a and 31b existing at the center axis of the substrate S are higher than the end portions of the first and second targets 31a and 31b opposite to the center axis of the substrate S.

While one embodiment of the present disclosure has been described above, AC power rather than DC power may be used as the electric power applied to the targets 31a and 31b. The inert gas for generating plasma is not limited to the Ar gas. Moreover, the present disclosure is not limited to the use of the magnet arrays 51. For example, it may be possible to use a method of applying high frequency power to the targets 31 and applying a high frequency bias to the mounting stand.

<Second Embodiment>

Figure 10:
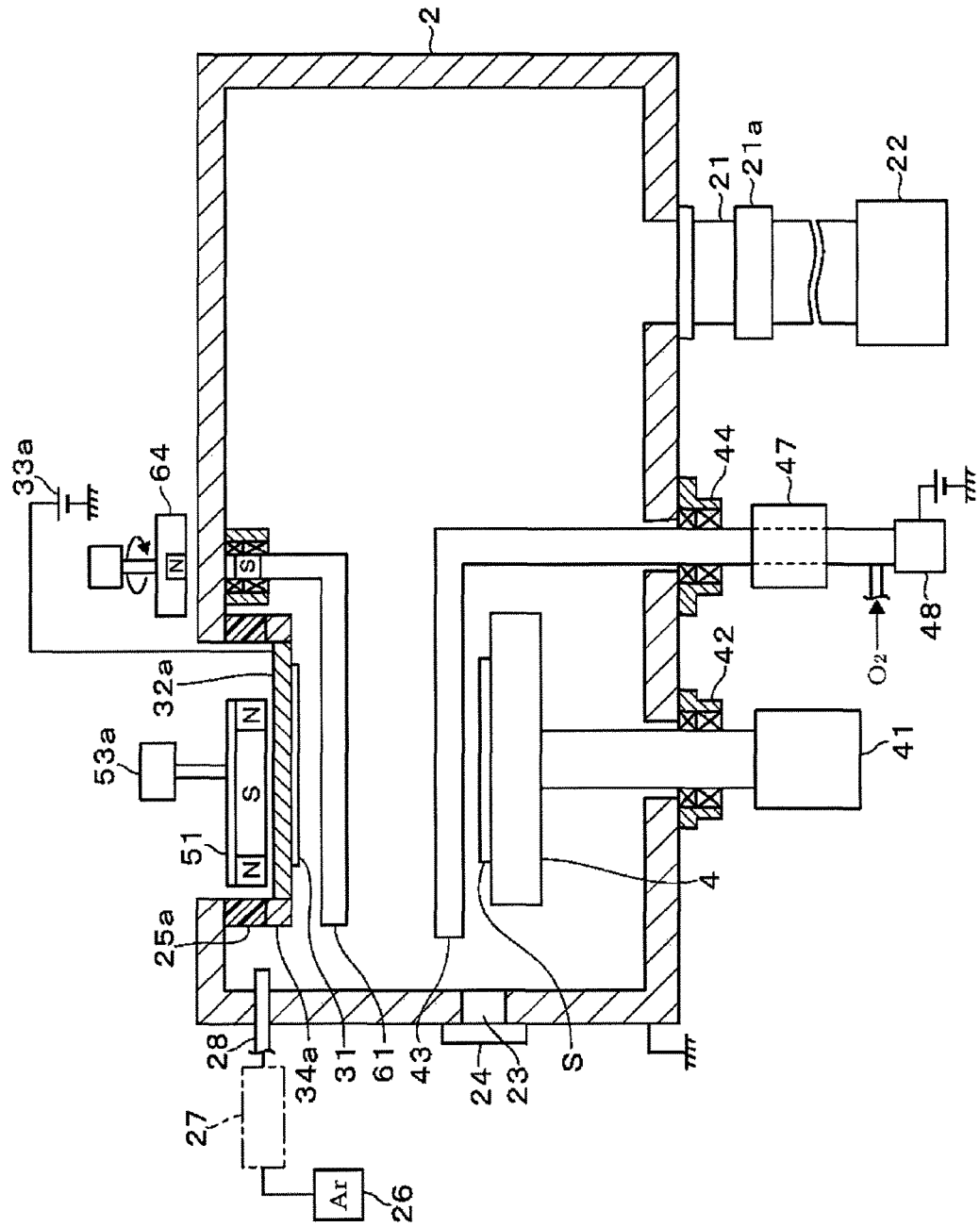
FIG. 10 is a vertical sectional view illustrating a vacuum-processing apparatus according to a second embodiment of the present disclosure.

In a second embodiment to be described below in detail, parts identical with those of the first embodiment described above will be designated by like reference symbols with no description made thereon. In the second embodiment, as shown in FIG. 10, the first target 31a and the second target 31b of the first embodiment are made common. In this case, the material of the targets 31a and 31b is a metal which forms a film on the substrate S and which absorbs oxygen to become an oxide. Examples of the material include Hf, Mg, an alloy thereof and the like.

First, the substrate S is carried into the vacuum container 2. Thereafter, the shutter 61 is opened and the cover plate 43 is positioned above the mounting unit 4. In this state, the target 31 is sputtered such that particles of the target 31 adhere to the inside of the vacuum container 2. Thus, gettering of oxygen and water is carried out. Next, the cover plate 43 is retracted from above the mounting unit 4. The target 31 is sputtered again such that target particles adhere to the substrate S to form a metal film. After the formation of the metal film, the cover plate 43 is positioned above the mounting unit 4 again. The shutter 61 is closed. An oxygen gas is supplied from the gas injection holes 45 of the cover plate 43 onto the substrate S, thereby oxidizing the metal film on the substrate S and forming a metal oxide film. The shutter 61 is opened while positioning the cover plate 43 above the mounting unit 4. The target 31 is sputtered and the gettering is performed again. Thereafter, the substrate S is carried out from the inside of the vacuum container 2.

In the second embodiment, the same effects as in the first embodiment are obtained. The modified examples described with respect to the first embodiment can be applied to the second embodiment.

<Example>

Using the apparatuses of the aforementioned embodiments, metal oxide films were sequentially formed on 25 silicon wafers. The resistance values of the oxide films of the substrates thus obtained were measured and the variations of the resistance values were investigated. Specifically, three layers of MgO films having a thickness of 3 Å were laminated under the conditions described in the aforementioned embodiments.

Other conditions are as follows.
The material of the target 31a (the gettering member): Ti
The material of the target 31b (the film-forming material): Mg
The diameter of the substrate S: 300 mm
The diameter of the cover plate 43: 450 mm
The voltage applied to the target electrode 32a: 380 V
The voltage applied to the target electrode 32b: 300 V
The distance between the substrate S and the targets 31a and 31b during sputtering: 260 mm <Comparative Example>

A vacuum-processing apparatus was used in which a chamber for performing sputtering (a sputtering chamber) and a chamber for performing oxidization (an oxidizing chamber) are separate from each other. An Mg film was formed on the substrate S in the sputtering chamber. Thereafter, the substrate S was carried into the oxidizing chamber under a vacuum state. The Mg film was oxidized into an MgO film in the oxidizing chamber. By repeating this process, oxide films were formed on 25 silicon wafers. The resistance values of the respective oxide films were measured and the variations of the resistance values were investigated.

More specifically, Mg was first sputtered in the sputtering chamber to form an Mg film having a thickness of 3 Å (0.3 nm). Thereafter, the substrate S was conveyed to the oxidizing chamber where an MgO film was formed by supplying oxygen to the Mg film. The substrate S was returned back to the sputtering chamber where Mg was sputtered again to form an Mg film having a thickness of 3 Å (0.3 nm). Then, the substrate S was conveyed to the oxidizing chamber where an MgO film was formed by supplying oxygen to the Mg film. The substrate S was returned back to the sputtering chamber where Mg was sputtered again. By repeating this process, an MgO film having a thickness of 9 Å (0.9 nm) was formed on the substrate S. The conveyance of the substrate S was performed under a vacuum atmosphere. In the aforementioned manner, MgO films were formed on 25 substrates S.

Figure 11:
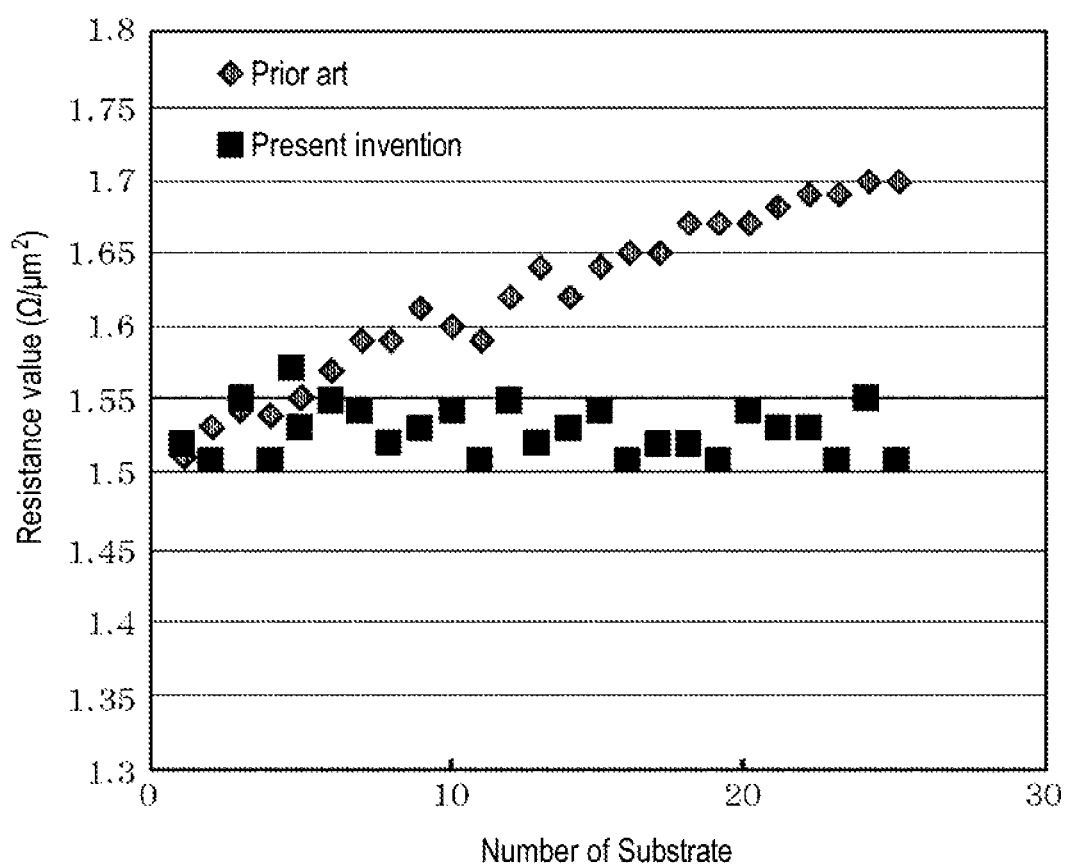
FIG. 11 is a view showing a distribution of resistance values of oxide films formed in an example and a comparative example.
Figure 12A:
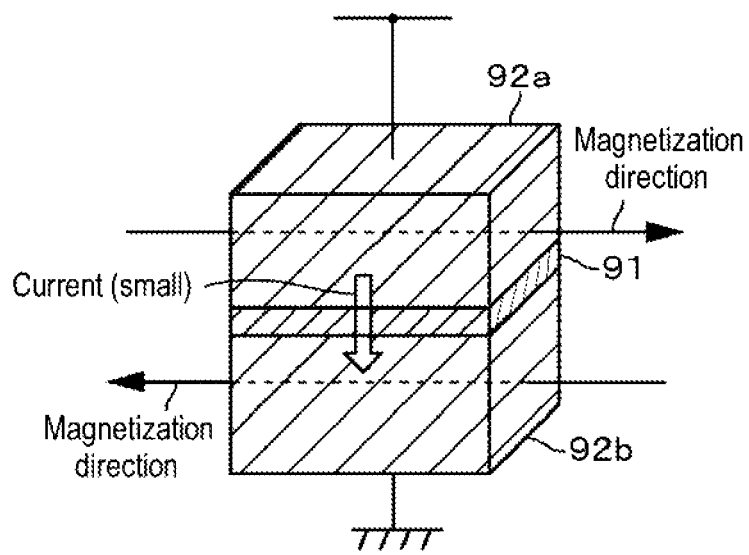
FIGS. 12A and 12B are schematic diagrams showing a basic mechanism of an MRAM memory device.
Figure 12B:
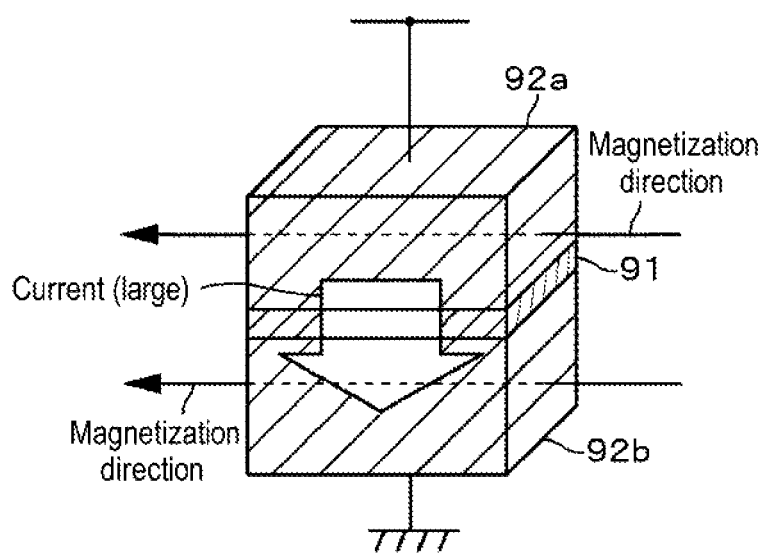

FIG. 11 shows the results. In FIG. 11, the variations of the resistance values between the substrates are shown by indicating the number of substrates in the horizontal axis and indicating the resistance value (unit: $\Omega/\mu m^2$) in the vertical axis. It can be noted in FIG. 11 that the resistance values of the metal oxide films becomes gradually larger in the comparative example, but the resistance values of the metal oxide films show a stable value at about 1.50 to 1.55 $\Omega/\mu m^2$ in the example. These results are analyzed as follows. That is to say, in the comparative example, the sputtering chamber and the oxidizing chamber are separate from each other. However, when conveying the substrate S between the chambers, oxygen is introduced from the oxidizing chamber into the sputtering chamber even if the degree of vacuum is kept high. Furthermore, oxygen remains within the oxidizing chamber. Thus, the MgO film is oxidized by the oxygen introduced into the sputtering chamber and the oxygen remaining within the oxidizing chamber. As a result, the resistance value becomes larger in the comparative example than in the example.

Using an apparatus configured by omitting the target 31a from the apparatus of the first embodiment, an MgO film was formed under the same conditions as in the first embodiment except that the step of sputtering Ti from the target 31a is not performed. The results obtained are as follows. The resistance value of the MgO film of the first substrate was 1.5 $\Omega/\mu m^2$. However, the resistance value became larger as the substrate processing goes on. In the $25^{th}$ substrate, the resistance value was larger than 3 $\Omega/\mu m^2$.

These results indicate that the oxide film forming method of the present embodiment makes great contribution to the stabilization of a resistance value of a metal oxide film used in an MRAM or the like.

What is claimed is:

1. A vacuum-processing method for forming a metal film on a substrate by sputtering a target disposed so as to face toward the substrate mounted on a mounting unit existing within a vacuum container, with ions of plasma obtained by converting a plasma-generating gas to plasma, and oxidizing the metal film, the method comprising:
   preparing a first target composed of a material having a property of adsorbing oxygen and a second target composed of a metal;
   covering the substrate on the mounting unit with a shielding member in order to prevent particles generated from the first target from adhering to the substrate, and disposing a shutter in a position facing the second target in order to prevent particles generated from the first target from adhering to the second target;

sputtering the first target by supplying a plasma-generating voltage to the first target, and causing particles of the first target to adhere to an inside of the vacuum container;

stopping the supply of the plasma-generating voltage to the first target, disposing the shutter in a position facing the first target in order to prevent particles generated from the second target from adhering to the first target, and retracting the shielding member from a position where the shielding member covers the substrate;

sputtering the second target by supplying a plasma-generating voltage to the second target, and forming a metal film on the substrate;

disposing the shutter in a position where the first target and the second target are shielded from the substrate when an oxygen-containing gas is supplied by gas injection holes;

the oxygen-containing gas supplied from a support post attached to a bottom of the vacuum container to the shielding member attached to the support post, wherein the shielding member includes the gas injection holes; and horizontally moving the gas injection holes of the shielding member by rotation from a retracted position to above the substrate and supplying the oxygen-containing gas downward toward the substrate mounted on the mounting unit, thereby oxidizing the metal film on the substrate, wherein the rotation is about an axis that is parallel to a center axis of the mounting unit.

2. A vacuum-processing method for forming a metal film on a substrate by sputtering a target disposed so as to face toward the substrate mounted on a mounting unit existing within a vacuum container, with ions of plasma obtained by converting a plasma-generating gas to plasma, and oxidizing the metal film, the method comprising:

preparing a target composed of a metal having a property of adsorbing oxygen;

shielding the substrate on the mounting unit with a shielding member in order to prevent particles generated from the target from adhering to the substrate;

sputtering the target by supplying a plasma-generating voltage to the target, and causing particles of the target to adhere to an inside of the vacuum container;

sputtering, in a state in which the shielding member is retracted from a position where the shielding member covers the substrate, the target by supplying a plasma-generating voltage to the target, and forming a metal film on the substrate;

disposing a shutter in a position where the target is shielded from the substrate when an oxygen-containing gas is supplied by gas injection holes;

the oxygen-containing gas supplied from a support post attached to a bottom of the vacuum container to the shielding member attached to the support post, wherein the shielding member includes the gas injection holes; and horizontally moving the gas injection holes of the shielding member by rotation from a retracted position to above the substrate and supplying the oxygen-containing gas downward toward the substrate mounted on the mounting unit, thereby oxidizing the metal film on the substrate, wherein the rotation is about an axis that is parallel to a center axis of the mounting unit.

3. The method of claim 1, wherein the oxygen-containing gas is supplied from the oxygen supply unit installed at the shielding member to the substrate.

4. The method of claim 1, wherein causing the particles of the first target used for adsorption of oxygen to adhere to the inside of the vacuum container is performed after a metal oxide film is formed on the substrate, before the substrate is carried out from the inside of the vacuum container and after a next substrate is replaced and carried into the vacuum container.

5. The method of claim 1, wherein metal oxide films laminated one above another are formed by sequentially repeating, a multiple number of times, causing the particles of the first target used for adsorption of oxygen to adhere to the inside of the vacuum container, forming the metal film on the substrate by sputtering, and supplying the oxygen-containing gas to the substrate mounted on the mounting unit.

6. The method of claim 5, wherein, with respect to at least two of the plurality of metal oxide films laminated one above another, flow rates of oxygen when supplying the oxygen-containing gas to the substrate are made different from each other.

7. The method of claim 1, wherein the oxygen-containing gas is heated before the oxygen-containing gas is injected from the oxygen supply unit into the vacuum container.

8. A storage medium which stores a computer program used in a vacuum process for forming a metal film on a substrate by sputtering a target disposed so as to face toward the substrate mounted on a mounting unit existing within a vacuum container, with ions of plasma obtained by converting a plasma-generating gas to plasma, and oxidizing the metal film, wherein the computer program is used to carry out the vacuum-processing method of claim 1.

* * * * *